(12) United States Patent
Næsje et al.

(10) Patent No.: US 12,397,667 B2
(45) Date of Patent: Aug. 26, 2025

(54) CIRCUIT BOARD FOR AN ELECTRIC VEHICLE CHARGING STATION

(71) Applicant: Easee AS, Sandnes (NO)

(72) Inventors: Kjetil Næsje, Sandnes (NO); Jonas Helmikstøl, Hafrsfjord (NO); Steffen Mølgaard, Stavanger (NO); Ola Stengel, Stavanger (NO)

(73) Assignee: Easee AS, Sandnes (NO)

( * ) Notice: Subject to any disclaimer, the term of this patent is extended or adjusted under 35 U.S.C. 154(b) by 798 days.

(21) Appl. No.: 17/439,875

(22) PCT Filed: Mar. 23, 2020

(86) PCT No.: PCT/NO2020/050081
§ 371 (c)(1),
(2) Date: Sep. 16, 2021

(87) PCT Pub. No.: WO2020/197406
PCT Pub. Date: Oct. 1, 2020

(65) Prior Publication Data
US 2022/0185132 A1    Jun. 16, 2022

(30) Foreign Application Priority Data

Mar. 22, 2019 (NO) .................................. 20190387

(51) Int. Cl.
*B60L 53/30* (2019.01)
*B60L 53/16* (2019.01)
(Continued)

(52) U.S. Cl.
CPC .............. *B60L 53/30* (2019.02); *B60L 53/16* (2019.02); *H01R 12/716* (2013.01); *H01R 13/6683* (2013.01); *H01R 2201/26* (2013.01)

(58) Field of Classification Search
CPC .......... B60L 53/16; B60L 53/30; B60L 53/31; B60L 53/302; H01R 12/716;
(Continued)

(56) References Cited

U.S. PATENT DOCUMENTS

| | | | |
|---|---|---|---|
| 9,490,640 | B2 | 11/2016 | Pham et al. |
| 2009/0195237 | A1 | 8/2009 | Feliss et al. |

(Continued)

FOREIGN PATENT DOCUMENTS

| | | |
|---|---|---|
| CN | 106505677 | 3/2017 |
| CN | 206179606 | 5/2017 |

(Continued)

OTHER PUBLICATIONS

Norwegian Search Report for No. 20190387, dated Oct. 22, 2019.
(Continued)

*Primary Examiner* — Richard Isla
*Assistant Examiner* — Johali A Torres Ruiz
(74) *Attorney, Agent, or Firm* — Andrus Intellectual Property Law, LLP

(57) ABSTRACT

A circuit board is for an electric vehicle charging station, having a temperature sensor and a conductive track having a terminal for transferring electrical power between the conductive track and the exterior of the charging station. The temperature sensor and the conductive track are separated by at least one insulation layer so that the temperature of the conductive track is measurable by the temperature sensor through the at least one insulation layer.

17 Claims, 6 Drawing Sheets

(51) Int. Cl.
*H01R 12/71* (2011.01)
*H01R 13/66* (2006.01)

(58) Field of Classification Search
CPC ............ H01R 13/6683; H01R 2201/26; H01R 2201/0195; H01R 2201/10151; Y02T 10/70; Y02T 10/7072; Y02T 90/12; Y02T 90/14; B60Y 2400/302
See application file for complete search history.

(56) References Cited

U.S. PATENT DOCUMENTS

| | | | |
|---|---|---|---|
| 2013/0040485 A1* | 2/2013 | Ngo ........................ | H01R 12/75 439/350 |
| 2015/0054462 A1 | 2/2015 | Weidinger | |
| 2015/0163864 A1* | 6/2015 | Baarman .............. | H05B 6/1236 99/358 |
| 2016/0006190 A1* | 1/2016 | Katsuura .................. | H02H 5/04 439/502 |
| 2016/0039297 A1 | 2/2016 | Horst et al. | |
| 2016/0094047 A1 | 3/2016 | Finkenzeller et al. | |
| 2017/0237205 A1 | 8/2017 | Fuehrer et al. | |
| 2017/0361722 A1* | 12/2017 | Köhler .................... | B60L 53/18 |
| 2018/0049310 A1 | 2/2018 | Lynch | |
| 2018/0097316 A1* | 4/2018 | Rose ........................ | H01R 12/58 |
| 2018/0159280 A1* | 6/2018 | Watanabe ................ | G01K 1/14 |
| 2018/0323606 A1* | 11/2018 | Zhang ................... | H02J 7/0048 |
| 2019/0260146 A1 | 8/2019 | Feldner et al. | |
| 2020/0124653 A1* | 4/2020 | Rahbari Asr ............ | G06N 3/08 |
| 2020/0185847 A1* | 6/2020 | Feldner .............. | H01R 13/6683 |
| 2021/0370785 A1* | 12/2021 | Malandain ............. | H01R 12/57 |

FOREIGN PATENT DOCUMENTS

| | | |
|---|---|---|
| DE | 4123870 | 1/1993 |
| DE | 102015104170 | 9/2016 |
| DE | 202017105818 | 11/2017 |
| DE | 202018002686 | 7/2018 |
| DE | 102018120057 | 2/2019 |
| EP | 2338722 | 6/2011 |
| GB | 2489988 | 10/2012 |
| WO | 2018001719 | 1/2018 |

OTHER PUBLICATIONS

International Search Report and the Written Opinion for PCT/NO2020/050081, dated May 28, 2020.
Response to the Written Opinion for PCT/NO2020/050081, dated Nov. 18, 2020.
The Second Written Opinion for PCT/NO2020/050081, dated Apr. 30, 2021.
International Preliminary Report on Patentability for PCT/NO2020/050081, dated Jun. 7, 2021.

* cited by examiner

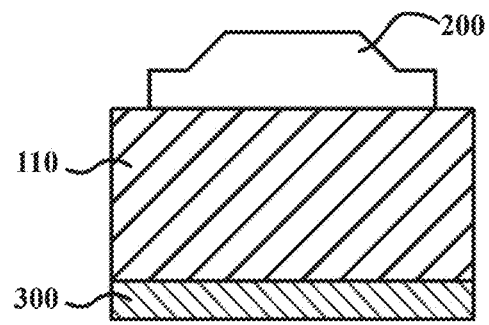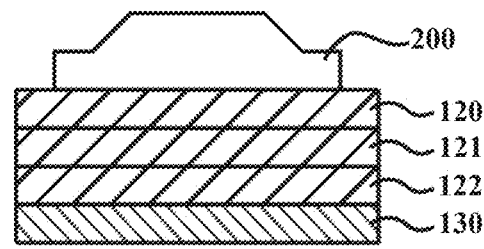
Fig. 4a   Fig. 4b
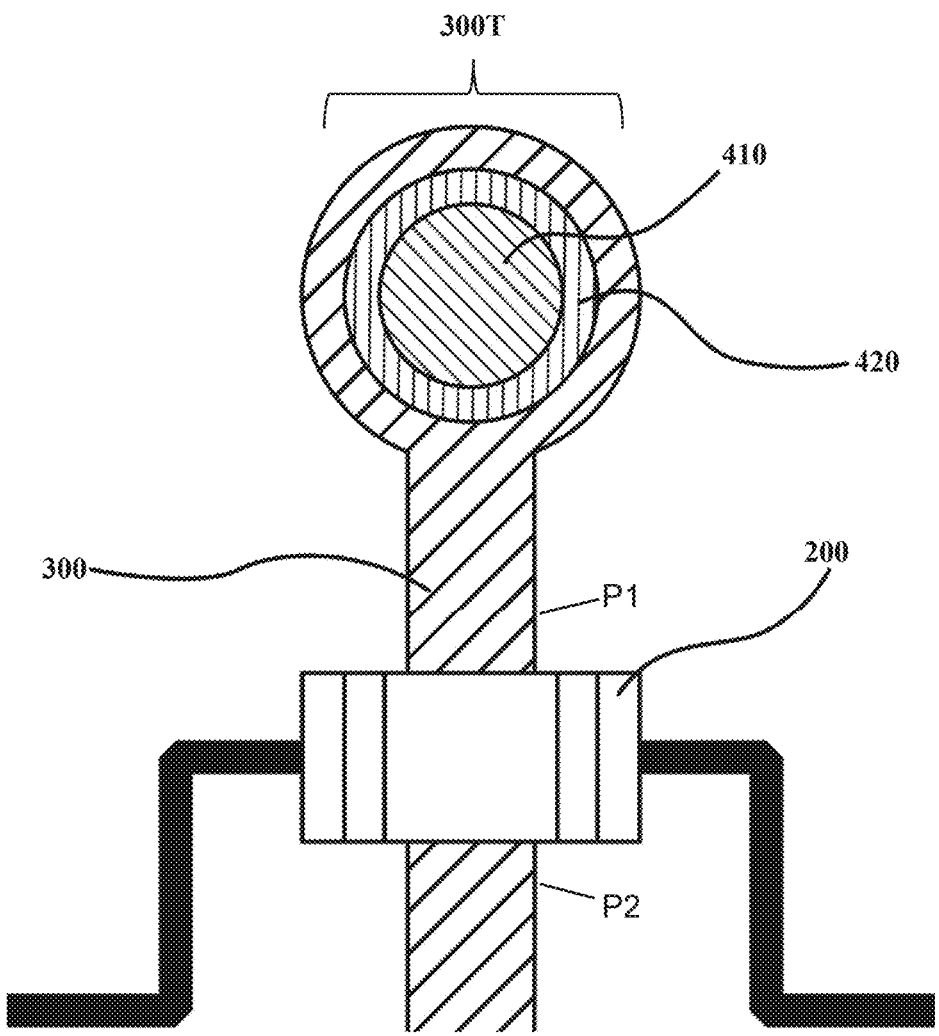
Fig. 5a

CIRCUIT BOARD FOR AN ELECTRIC VEHICLE CHARGING STATION

CROSS-REFERENCE TO RELATED APPLICATIONS

This application is the U.S. national stage application of International Application PCT/NO2020/050081, filed Mar. 23, 2020, which international application was published on Oct. 1, 2021, as International Publication WO 2020/197406 in the English language. The International Application claims priority of Norwegian Patent Application No. 20190387, filed Mar. 22, 2019. The international application and Norwegian application are both incorporated herein by reference, in entirety.

FIELD OF THE INVENTION

The present invention relates to a circuit board for an electric vehicle charging station and to an electric vehicle charging station comprising the circuit board. Also, the present invention relates to a method of monitoring an electric vehicle charging station.

BACKGROUND OF THE INVENTION

Nowadays, dedicated charging stations are increasingly being used for recharging electric vehicles (EV) after use. EV charging stations are known to include several features for an improved usability and operability. For example: a user interface may be provided for allowing a user to configure a charging cycle more precisely (e.g. setting when and how the charging cycles occur); a socket may be provided for connecting a standard type of EV plug connector, such as the IEC 62196 type 2 connector type (also known as the Mennekes connector type); features for connecting the charging station to the Internet, such as a wireless adapter, may be provided so that the station can be remotely controlled by a user or that the station may carry out a charging cycle autonomously based on the electricity prices; and features may be implemented so that the stations connected to the same fuse cabinet communicate with each other and achieve an efficient electrical coordination (e.g. by optimizing the electrical phases selected in each station).

EV charging stations can be installed in public and private locations. Some governments and municipalities provide public charging spots where an EV owner may recharge his EV at a reduced fee or, in some cases, free of charge. In the case of private locations, many EV owners install EV charging stations at home, such as in a garage. Also, many companies provide some of their parking spaces with charging stations for the employees to use and recharge EVs after use. A charging station may be installed outdoors and exposed to rain or humidity, such as near a parking space without ceiling or near a slipway for moving boats to or from the water.

The characteristics of the charging cycles may differ from station to station, but some aspects are common to most charging stations. Typically, a charging cycle in known EV charging stations takes a duration from 6 to 12 hours. Also, during the charging cycle, the EV and the charging station are normally left without supervision. Moreover, the currents transferred to the EV charging station and between the charging station and the EV are normally high, such as from 13 to 60 A.

The transmission of the charging currents through components, conductors, and contacts may lead to hazardous conditions, such as an excessively high temperature due to an increased electrical resistance or the production of electric arcs. An increased temperature is not dangerous in most cases but, if excessive, can result in melted parts or fire. Malfunction of the charging station can in turn cause damage to the EV or cause lethal voltages to be exposed to the user. Moreover, the production of electric arcs is very dangerous and can quickly lead to unexpected heating and easily start a fire. For example, a continuous arc can occur in a small contact between conductors in a socket, which can lead to a fire that can damage the charging station, the EV and/or the location in which the charging cycle is being carried out. It is therefore an important aspect in the development of EV charging stations to minimize threatening circumstances caused by the transmission of the charging currents.

It can be challenging to monitor and control the temperature and the occurrence of electric arcs in an EV charging station.

A known approach is to provide at least one thermal sensor inside a connector, such as a plug of the cable connecting the EV to the charging station. In particular, the sensor is arranged inside a housing that is shared with the electrical conductors (also known as pins or prongs), so that the sensor may indirectly measure the temperature of the conductors by measuring the temperature of the housing. This temperature is then monitored and compared against a preconfigured maximum value, and the power supply to the EV is either turned off or kept on based on this comparison. Documents GB 2489988 A and U.S. Pat. No. 9,490,640 B2 provide examples of this approach.

In practice, the following drawbacks are observed in this approach.

It can be difficult to obtain a separate temperature measurement of each conductor in the plug. In embodiments of this approach, it is often found that more than one conductor influences the measurements of a sensor. This makes it difficult to detect if the temperature has increased because of one conductor or if it has increased because of all conductors.

In some situations, it may be crucial to avoid damage by stopping the charging operation when the temperature of a single conductor increases quickly, even if the final temperature of this increase is under a global maximum temperature.

Most embodiments of this approach are too slow in detecting an increase in temperature that may be harmful. Sometimes, a continuous arc occurs within the power socket connected to the conductor and that condition is only detected after either part of the socket has been damaged or when a fire has already begun.

Moreover, opting for providing the temperature monitoring and controlling features at the cable/plug level requires implementing a manufacturing process for the cable in addition to the one for the EV charging station. The manufacturing process of the cable may be difficult to automate, require manual work, and be expensive to implement.

Another known approach is mentioned in page 13, lines 18-27 of the document GB 2489988 A: the manufactures of charging equipment manage the problem of excess heat build-up by limiting the charge current to a fraction of the rated charge current available. However, this approach has the disadvantage of imposing a longer charging cycle time on the users. Particularly, this is undesirable because a general objective in the development and design of an EV charging station is that it achieves the fastest possible charging.

Patent publication US2018/0097316A1 discloses a plug-in connector part for connection to a mating plug-in connector part. The plug-in connector includes: i) a housing part; ii) at least one electrical contact element, which is arranged on the housing part, for establishing electrical contact with the mating plug-in connector part; iii) and a temperature-monitoring device including at least one sensor device for detecting a rise in temperature of the at least one contact element. The temperature-monitoring device includes a support element that extends over an entire surface thereof along a plane and includes at least one opening and one contact surface arranged at the at least one opening. The at least one contact element extends through the at least one opening such that the at least one contact element abuts the contact surface, and the at least one sensor device being arranged on the support element so as to detect a rise in temperature of the at least one contact element.

SUMMARY OF THE INVENTION

The invention is defined by the independent claims. The dependent claims define advantageous embodiments.

According to a first aspect of the present invention, there is provided a circuit board for an electric vehicle charging station, comprising: circuitry for the electric vehicle charging station, a temperature sensor; and a conductive track having a terminal for transferring electrical power between the conductive track and the exterior of the charging station, wherein the temperature sensor and the conductive track are separated by at least one insulation layer so that the temperature of the conductive track is measurable by the temperature sensor through the at least one insulation layer.

The effect of the circuit board in accordance with the invention is as follows. The circuit board (which is the main circuit board for the charging station) typically comprises circuitry for enabling the electric vehicle charging station to charge an electric vehicle. The circuitry may typically comprise components like relays, contactors, power supply and control electronics, for example. The invention is about temperature measurement on the main printed-circuit board (PCB) of the charging station instead of at a location close to the pins of the plug as US2018/0097316A1. While in the most basic embodiments the main printed-circuit board may contain mainly conductive tracks connecting the electrical connectors with each other in a fixed manner (making the charging only suitable for one configuration and standard). However, more practical embodiments will require said further circuitry to make the charging station robust, flexible and compliant with standards and requirements.

As mentioned, the circuitry is typically placed on a printed-circuit board (also referred to as circuit board in this specification). The inventors got the insight that this also implies that charging currents will run through conductive tracks on the printed-circuit board. Then the inventors realized that it is much easier and cheaper to carry out temperature monitoring on the main printed-circuit board. The printed-circuit board is typically built up of electrically insulating material and provided with conductive tracks and further insulating layers. These insulating layers are typically very thin and conduct heat very well. So, having this insight, it suddenly becomes easy to carry out temperature monitoring in an electric vehicle charging station, namely by implementing a temperature sensor over a conductive track yet being separated from it by at least one insulation layer. The resulting solution is compact and very low-cost. On PCB-temperature monitoring as the current invention proposes has not been done before. The common assumption in the prior art is that it should be done inside the plug.

In contrast with the invention document US2018/0097316A1 discloses an expensive solution having a support element, which basically is an extra printed-circuit board (PCB) having holes through which the contact elements protrude. Around each hole there is a thin conductive ring (a via made of metal) and optionally the ring is coupled with a coupling portion (which also is a thin conductive track) is electrically insulated from but thermally coupled with the temperature sensor. Even though the ring and the coupling portion are electrically conductive, it is the thermal conductivity, which is used. From an electrical viewpoint the ring and the coupling portion are on the same potential as the contact element and do not conduct any current. It must be further noted that the printed-circuit board in US2018/0097316A1 only comprises the holes, the rings, the coupling portions and the temperature sensors. Document US2018/0097316A1 discloses that there is a challenge to put all these elements on the printed-circuit board, because the locations and distances between the contact elements of the plug-and-socket are standardized, for example the type-2 plug-and-socket standard.

As a matter of fact the solution of document USb 2018/0097316A1 could be combined with the solution as presented by the invention, because they operate at different levels in the charging station), yet this expensive solution is rendered completely superfluous by the invention.

Each of the at least one insulation layer may be a layer of the circuit board. Also, two insulation layers may be contiguous. Moreover, the at least one insulation layer may be made of glass fibre.

The terminal may be connectable to an electrical connector for transferring electrical power from the conductive track to an electric vehicle, or the terminal may be connectable to an electrical connector for transferring electrical power from the exterior of the charging station to the conductive track.

The temperature sensor may be a thermistor.

In one embodiment, the sensor and the track may be separated by a set of three insulation layers, the set having a thickness of from 200 to 300 μm.

According to a second aspect of the present invention, there is provided an electric vehicle charging station comprising a circuit board described above. The charging station may include an electrical connector for transferring electrical power between the circuit board and the exterior of the charging station, the electrical connector being connectable to the terminal of the conductive track.

It has been realised that the use of a connector for transferring electrical power with the exterior of the electrical vehicle charging station has a high risk of causing dangerous circumstances. For example, a manufactured circuit board does not have a risk of causing dangerous circumstances as high as the use of the connector. Typically, the manufacturing process of the circuit board can be automated with robotic precision and it undergoes many quality checks; however, the use of the connectors will depend many times on arbitrary circumstances, such as a user correctly connecting a plug of an electrical cable, an electrician not failing to correctly screw an electrical connector, or the level of humidity in the air not being too high. Thus, tackling the problem of monitoring the temperature on the connectors to the exterior of the charging station is advantageous.

In one embodiment, every electrical connector for transferring electrical power between the circuit board and the exterior of the charging station may be connectable to a terminal as described when mentioning the circuit board above.

According to a third aspect of the present invention, there is provided a method of controlling the transference of electrical power between the conductive track of the circuit board as described above and the exterior of an electric vehicle charging station. The method comprises the steps:

reading a first measurement from the temperature sensor;
waiting a pre-configured amount of time;
reading a second measurement from the temperature sensor;
calculating the temperature variation between the second and the first measurements;
if the temperature variation is greater than a pre-configured maximum temperature increase, break the transference of electrical power between the conductive track and the exterior of the charging station.

Advantageously, a sudden temperature increase in one conductive track can be detected without requiring other conductive tracks or connectors to further increase the temperature. In comparison to a maximum temperature threshold approach, this method permits breaking the passage of electrical current in a conductive track, even when the temperature measurements are under a maximum temperature threshold. It permits avoiding an arc related incident in the initial stage of a continuous arc.

The method may also comprise the step:

if the temperature variation is not greater than the pre-configured maximum temperature increase, enable, if not already enabled, the transference of electrical power between the conductive track and the exterior of the charging station.

Moreover, the pre-configured amount of time may be five seconds and the pre-configured maximum temperature increase may be ten degrees Celsius.

BRIEF DESCRIPTION OF THE DRAWINGS

Embodiments of the invention will now be described, by way of example only, with reference to the accompanying drawings, in which:

FIGS. 4a-4b are cross-sectional elevation views of two insulation embodiments;

FIGS. 5a-5b are top semi cross-sectional views of two circuit board embodiments having different arrangements of conductive tracks;

DETAILED DESCRIPTION OF THE EMBODIMENTS

Figure 1:
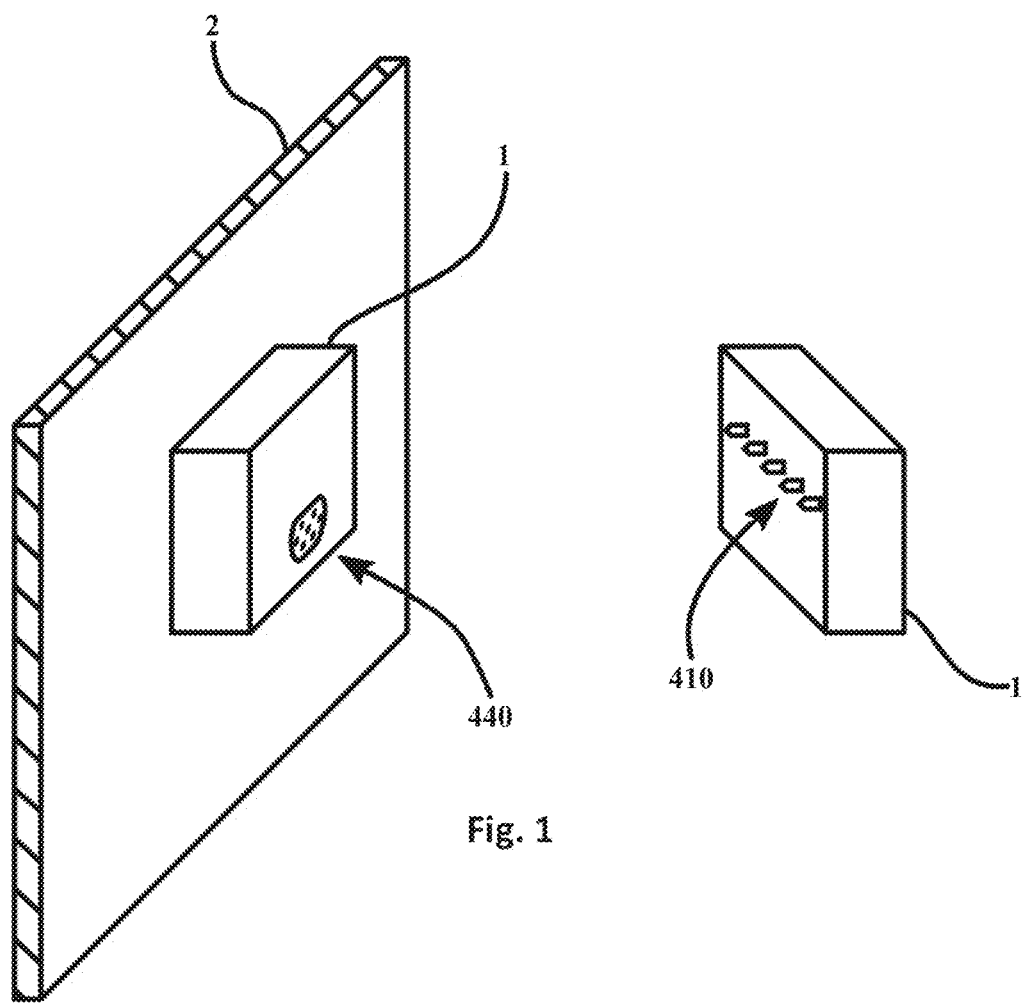
FIG. 1 is two perspective views of a wall-mounted EV charging station.

Turning now to FIG. 1, it shows two perspective views of a wall-mounted EV charging station 1 embodiment.

On the left-hand side of FIG. 1, a first perspective view shows the EV charging station 1 mounted on a wall 2. The EV charging station 1 includes a type 2 (IEC 62196) socket connector 440 on the front side to allow connecting an electrical cable between the EV charging station 1 and an EV (not shown).

On the right-hand side of FIG. 1, a second perspective view shows the EV charging station 1 floating in front its position on the first perspective. This representation has been chosen for the illustrative purpose of showing the input pin connectors on the back side of the EV charging station 1.

The EV charging station 1 includes five input pin connectors, projecting from the back side of the EV charging station 1, for receiving input electrical signals. Each input pin connector 410 is arranged on the back side of the EV charging station 1 so that, when the latter is mounted on the wall 2, an electrical connection is established between the five pin connectors and a set of corresponding electrical connectors (not shown) on the wall 2. This may be achieved by having the corresponding electrical connectors provided on a plate (not shown) fixed to the wall 2, the plate providing both the functions of supporting the EV charging station 1 and establishing the electrical connection with the input pin connectors. Moreover, the corresponding electrical connectors may be connected to the terminals of an electrical installation for connecting the EV charging station 1 to a fuse cabinet from which electrical power is consumed.

Both the type 2 socket connector 440, on the front side of the EV charging station 1, and the input pin connectors, on the back side, include electrical conductors (such as pins or prongs) for transferring electrical power between the exterior of the EV charging station 1 and its interior, the electrical power being the one used for recharging the EV. In particular, the EV charging station 1 includes in its interior a circuit board (not shown by the perspectives in FIG. 1) connected to these conductors and configured to control how the electrical power from the input pin connectors is routed to the socket connector 440. The circuit board may include features for providing an improved usability and operability, such as features for selecting the electrical phases supplied to the input pin connectors.

Figure 2A:
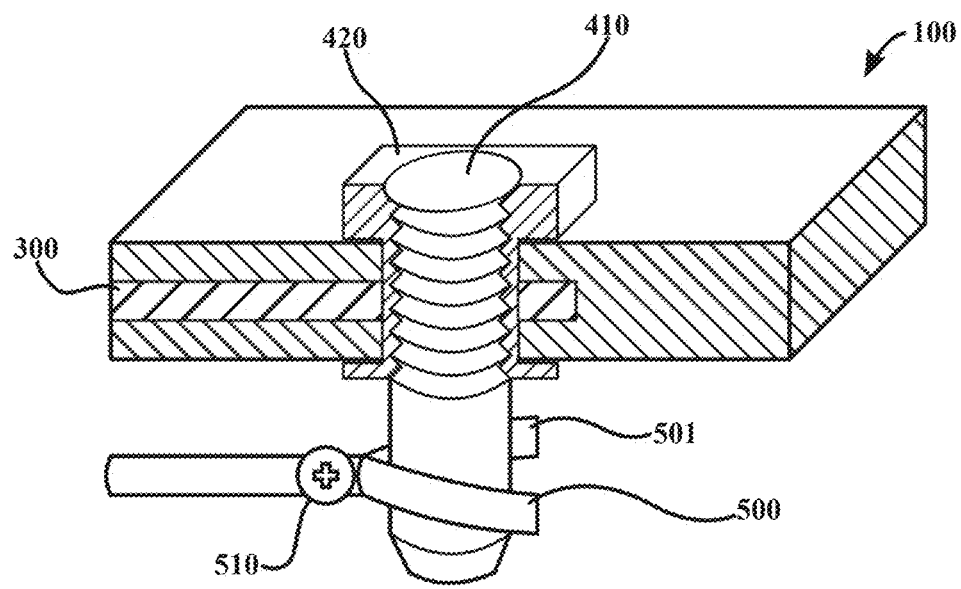
FIGS. 2a2b are semi cross-sectional views of known electrical connectors in the EV charging station in FIG. 1.
Figure 2B:
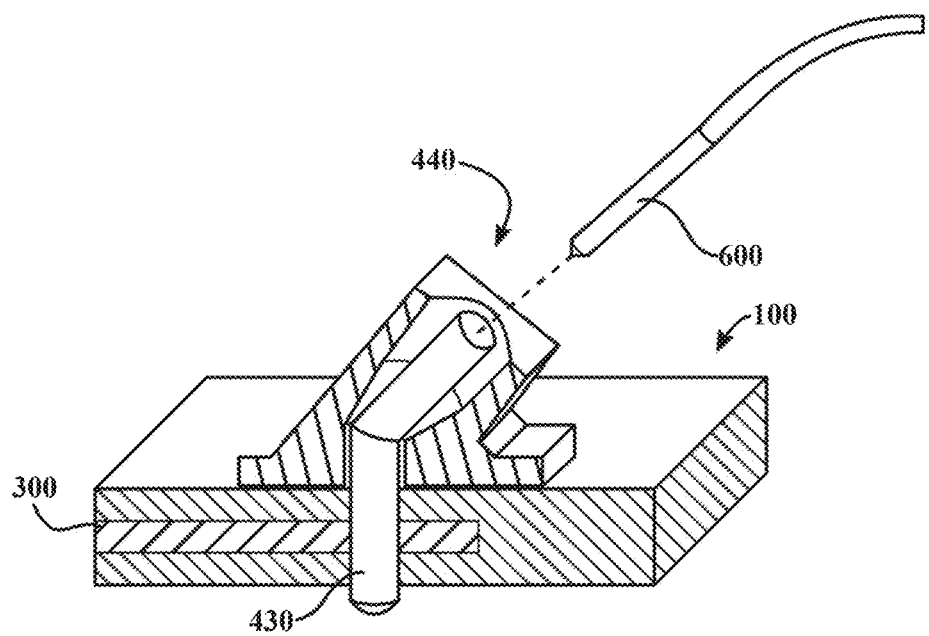

FIGS. 2a and 2b show semi cross-sectional views of two electrical connectors that are used in the circuit board 100 of the EV charging station 1 in FIG. 1. This circuit board 100 is the main circuit board of the charging station 1. It typically comprises various circuits for enabling the charging station to charge the electric vehicle. It must be noted that the circuit board 100 in FIG. 2a is the same circuit board 100 as in FIG. 2b.

FIG. 2a shows an electrical connection established on the back side of the EV charging station 1 in FIG. 1. The electrical connection is established between an input pin connector 410 and a fork connector installed on a plate (not shown) fixed to the wall 2 in FIG. 1.

A cross-section of part of a circuit board 100 is shown, including a mounting hole, which goes through the circuit board 100, occupied with an insert nut 420. A conductive track 300 is also included for conducting an electrical signal received on the insert nut 420 to some other component in the circuit board 100. The input pin connector 410 is screwed into the insert nut 420 and this contact conducts electricity. Thus, any electrical signal transmitted to the input pin connector 410 is transmitted to the insert nut 420 and, subsequently, to the conductive track 300.

The fork connector includes two arms 500, 501 arranged for contacting the input pin connector 410 when the EV charging station 1 is mounted on the wall 2. The input pin connector 410 fits between the two arms 500, 501. The fork connector is attached to the plate on the wall 2 by means of a screw 510.

Two heat creating effects may be observed when an electrical current for recharging an EV is passing through the components: an increased temperature due to electrical resistance, in particular in the contact surfaces, and the occurrence of arcs, which may happen due to loose couplings between conductors, insulation breakdown between conducting paths caused by severe over-voltages, or the presence of a conducting material, such as salt and conducting dust, on the insulator between conducting paths. In practice, it has been observed that the use of the input pin connector 410 shown in FIG. 2a may cause increased resistance and/or arcs in the following contacts:

- between the threads of the input pin connector 410 and the inner threads of the insert nut 420. If there is a small gap between the contact surfaces of the threads, a high resistance and/or a continuous arc may be formed whenever an electrical current is transmitted between the input pin 410 and the insert nut 420. This can usually be minimised by screwing the input pin connector 410 to the insert nut 420 using a screwdriver with sufficient torque, such as 5 Nm (Newton/meter);
- between the input pin connector 410 and the two arms 500, 501 of the for connector. This may happen if the input pin connector on the back of the EV charging station 1 and the fork connector on the plate fixed to the wall 2 are not properly aligned;
- between the base of the fork arms 500, 501 and the conductor from the electrical installation that provides electrical power from the fuse cabinet. This may happen if the fork connector has not been properly installed on the plate, such as due to the screw 510 fixing the fork connector to the plate on the wall 2 not being tightly screwed.

FIG. 2b shows a cross-sectional view of the type 2 socket connector 440 that is on the front side of the EV charging station 1 in FIG. 1. Only one female pin 430 is shown inside the part of the type 2 socket connector 440 that appears in FIG. 2b. Also, part of an end of an electrical cable is shown terminating in a male pin 600. The electrical cable can be used for connecting the EV charging station 1 and an EV (not shown).

In this connector, the electrical connection is established through the following circuit: the conductive track 300 in the circuit board 100 transmits electrical power to the female pin 430, which is in direct contact, e.g. soldered, with the conductive track 300; and the female pin 430, in turn, transmits the received electrical power to the male pin 600, which is fitted onto the end of the female pin 430. In practice, it has been observed that the following contacts may cause arcs:

- the contact surfaces between the male pin 600 and the female pin 430. This may happen due to the plug of the electrical cable, of which the male pin 600 is part, being incorrectly attached to the type 2 socket 440.
- the contact surface between the female pin 430 and the conductive track 300. This may happen due to a defect in soldering the female pin 430 to the circuit board 100.

Figure 3:
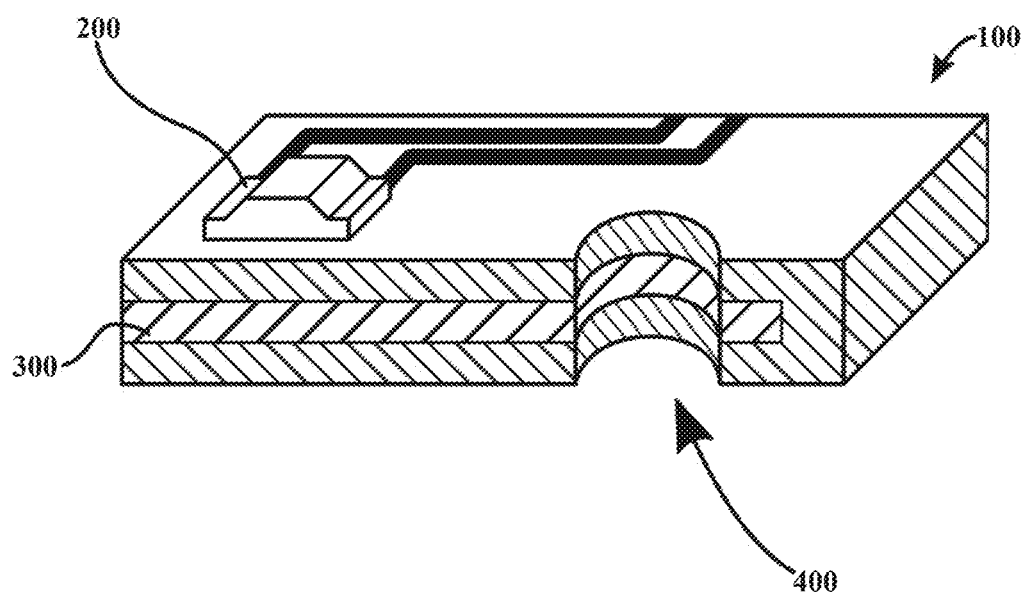
FIG. 3 is a cross-sectional view of a first circuit board embodiment.

FIG. 3 illustrates a circuit board 100 embodiment according to an aspect of the present invention.

The circuit board 100 includes a conductive track 300 for conducting an electrical signal for recharging an EV, a mounting hole 400 terminating the conductive track 300, and a temperature sensor 200 for measuring the temperature of the conductive track 300. The temperature sensor 200 may be a thermistor or any other resistor whose resistance is dependent on temperature, more so than in standard resistors. In case of a thermistor, any of the types positive or negative temperature coefficient may be used. In a preferred embodiment using a thermistor, a negative temperature coefficient thermistor is used.

The conductive track 300, made of a typical conductive material used in circuit boards (such as copper), terminates around the mounting hole 400, thus forming a terminal in that area. The mounting hole 400 can be used to attach an electrical connector to the circuit board in its location and establish a connection with the terminal of the conductive track 300. Any of the two connectors shown in FIGS. 2a and 2b are compatible with a mounting hole as the one shown in FIG. 3.

The temperature sensor 200 is located on a surface of the circuit board 100, parallel to the conductive track 300 and at a distance from the mounting hole 400. It has been realised that this arrangement achieves an electrically safe design in the case of an air ionization effect happening around an electrical connector attached to the circuit board at the location of the mounting hole 400. The distance between the mounting hole 400 and the temperature sensor 200 makes it more difficult for a discharge to occur between the electrical connector and the terminals of the temperature sensor 200. This distance may be established as requirement by a certification authority, or it may be configured by the skilled person on a case by case basis. In a preferred embodiment, a minimum distance of 6 mm is used.

Also, it has been realised that abnormal temperature increases or the occurrence of arcs in the contact surfaces related to an electrical connector attached at the mounting hole 400 may be monitored by measuring the temperature of the conductive track 300, as the latter is a good conductor of both electricity and heat. Using a portion of the circuit board as an insulation layer intermediating the temperature sensor 200 and the conductive track 300 avoids the air ionization problem that is observed when measuring the temperature of an electrical connector in the mounting hole 400.

Moreover, measuring the temperature of the conductive track 300 in the embodiment shown in FIG. 3 has proven to be a surprisingly efficient way of detecting the occurrence of arcs. The heat caused by the latter quickly flows through the conductive track 300, and this causes an increase in temperature to be detected by the sensor 200. In practice, it is observed that the detection time in this circuit board embodiment is much lower than in known approaches, such as the one mentioned in the present disclosure. Even though the temperature sensor 200 may be farther away from the location where an arc occurs than in other approaches, the temperature sensor 200 is quicker in sensing a temperature change.

Furthermore, it must be noted that the embodiment shown in FIG. 3 is advantageous in terms of the effort that is required to produce it, due to its simplicity. The manufacturing process of the circuit board 100 can incorporate the implementation of the embodiment by additionally including a specification of the components and their arrangement in the circuit board 100. Thus, no unusual manufacturing changes are necessary in order to achieve the ability to monitor and control the temperature and the occurrence of arcs in an EV charging station 1.

FIGS. 4a and 4b show cross-sectional elevation views of two embodiments for the insulation provided between the temperature sensor 200 in FIG. 3 and the conductive track 300.

FIG. 4a shows a single insulation layer 110 embodiment intermediating the temperature sensor 200 and the conductive track 300. The insulation layer 110 may be made of any insulation material typically used in circuit boards, such as glass fibre.

The insulation layer 110 must have a thickness that allows the temperature sensor 200 to be insulated from the electrical current passing in the conductive track 300, but also allows the temperature sensor 200 to measure the temperature of the conductive track 300 through the insulation layer 110. The minimum thickness of the insulation layer 110 may be established by a certification authority, or it may be defined by the skilled person on a case by case basis. In a preferred embodiment, the insulation layer 110 has a minimum thickness of 500 µm.

FIG. 4b shows an embodiment in which the temperature sensor 200 and the conductive track 300 are intermediated by a stack of three insulation layers 120, 121, 122. The top insulation layer 120 is contiguous with the middle insulation layer 121, and the bottom insulation layer 122 is contiguous with the middle insulation layer 121.

It has been realised that by intermediating the sensor 200 and the conductive track 300 with more than one insulation layer 120, 121, 122 an advantageously reduced thickness can be used for achieving the same insulation quality. The temperature sensor 200 is thus positioned at a shorter distance from the conductive track 300 without suffering a negative effect from an electrical current being transferred in the conductive track 300. The minimum thickness of the three insulation layers 120, 121, 122 may be established by a certification authority, or it may be defined by the skilled person on a case by case basis. In a preferred embodiment, the temperature sensor 200 and the conductive track 300 are separated by a set of three insulation layers 120, 121, 122, the set having a thickness of from 200 to 300 µm.

Figure 5B:
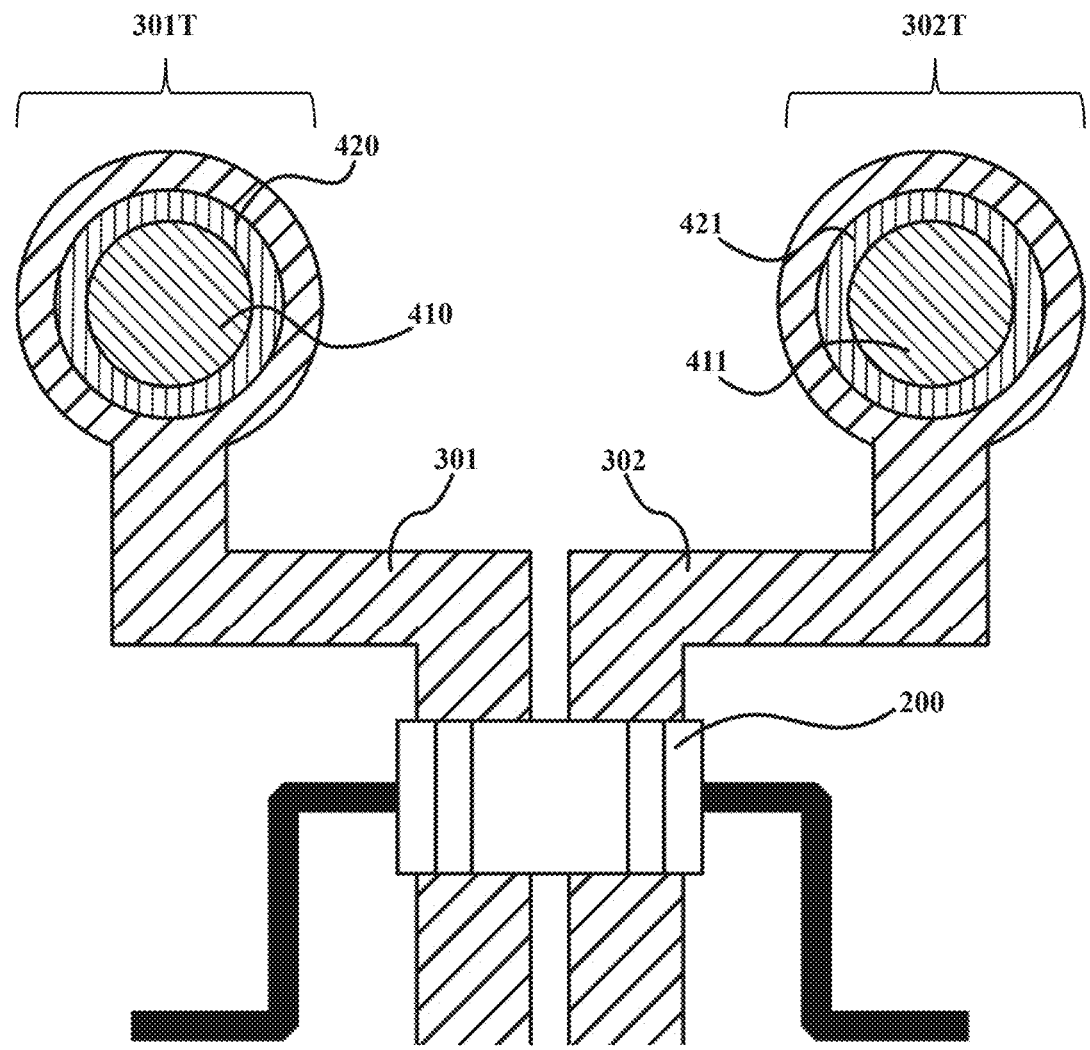

FIGS. 5a and 5b are top semi cross-sectional views of two circuit board embodiments having two different arrangements between a temperature sensor 200 and the conductive tracks 300, 301, 302 being monitored. In both figures, at least one input pin connector 410, 411 is shown from above. At least one insert nut 420, 421 is also shown in a cross-cut illustration, so that the terminal (300T, 301T, 302T) of the respective conductive track 300, 301, 302 is also shown. Moreover, the circuit board 100, including the insulation between the temperature sensor 200 and the conductive layers 300, 301, 302 has been hidden, and thus the temperature sensor 200 appears to be floating above the conductive layers 300, 301, 302. This representation has been chosen for the illustrative purpose of showing where the temperature sensor is positioned relative to the conductive tracks 300, 301, 302.

In FIG. 5a, a single temperature sensor 200 is used for monitoring the temperature of one conductive track 300 through which current flows at least between a first position P1 and a second position P1, here measuring the temperature therebetween. The conductive track 300 has one terminal (300T) surrounding an insert nut 420, which in turn surrounds an input pin connector 410

In FIG. 5b, the temperature sensor 200 is monitoring the temperature of two conductive tracks 301, 302, which were designed so that both may be measured by the same temperature sensor 200.

Figure 6:
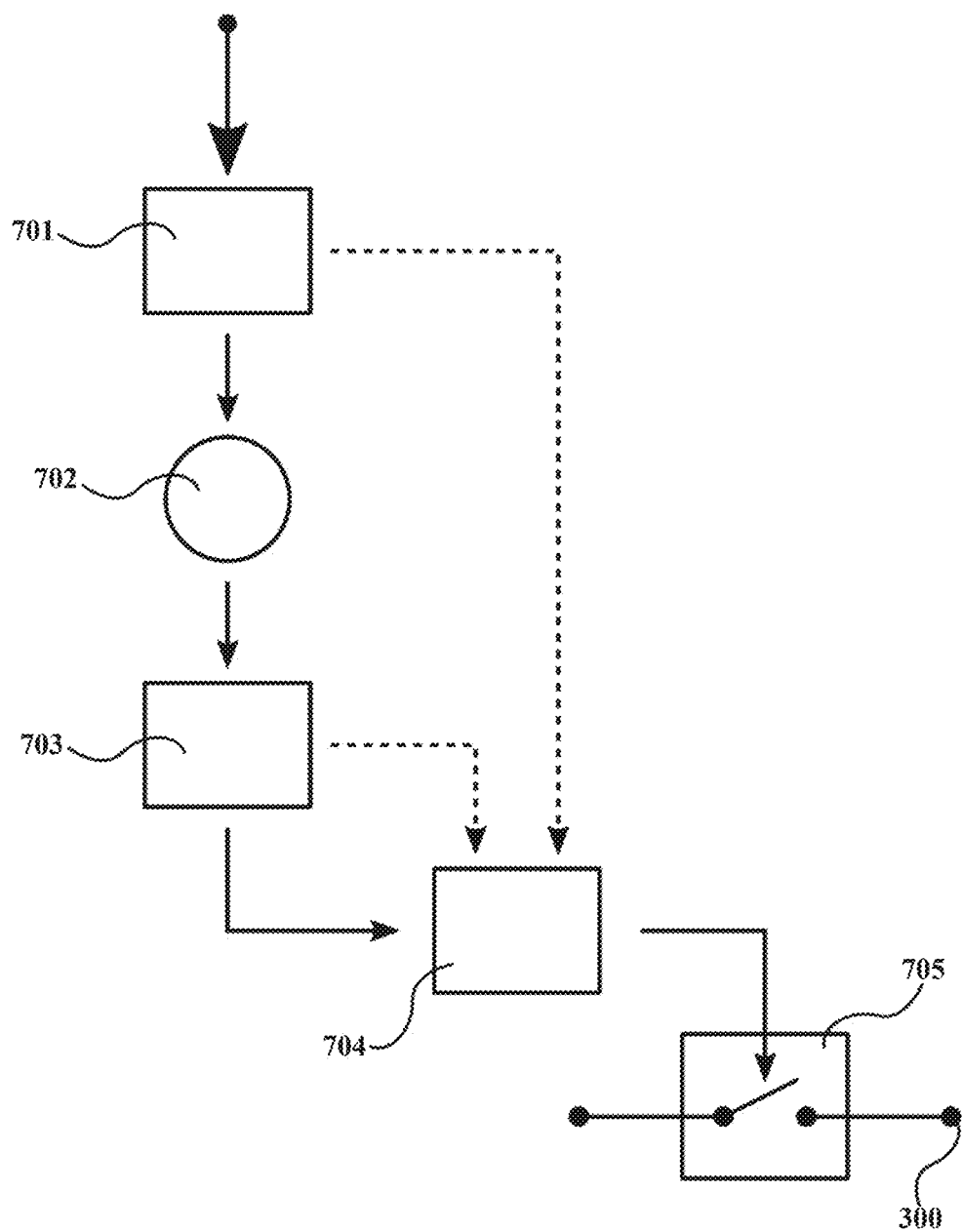
FIG. 6 is a schematic view of a method of controlling the transference of electrical power with the conductive track of a circuit board embodiment.

FIG. 6 shows a schematic view of a method embodiment that allows controlling the transference of electrical power in a conductive track 300 of a circuit board 100. The circuit board 100 includes a switch 705 for controlling the passage of current in the conductive track 300.

The method has an initial step 701 of reading a first measurement from a temperature sensor 200. After that, the method pauses and waits for a pre-configured amount of time 702, such as five seconds. Then, a second measurement is obtained 703 from the temperature sensor 200, and both the first measurement from the initial step 701 and the second measurement from the last step 703 are compared in a further step 704 to calculate the temperature variation between the two measurements. This temperature variation is then used for controlling the switch 705.

If the temperature variation is greater than a pre-configured maximum temperature increase, such as ten degrees Celsius, the switch 705 breaks the passage of electrical current in the conductive track 300.

In one embodiment, the method may also include a step of checking if the temperature variation is not greater than the pre-configured maximum temperature increase. In this case, it may enable, if not already enabled, the passage of electrical current in the conductive track 300.

Embodiments of the invention may have some or all of the following advantages:
- a higher sensibility to increases in temperature or to the occurrence of arcs
- a quicker detection time when an arc occurs
- a simple manufacturing process
- a good accuracy in monitoring a single conductive track, which in turn allows monitoring a single connector.

Figure 7A:
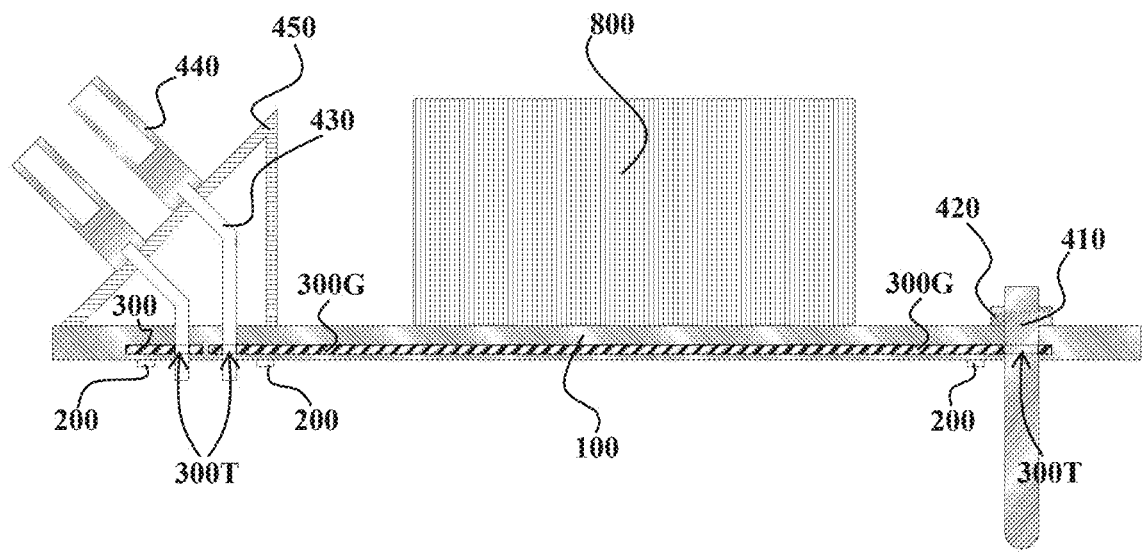
FIGS. 7a-7b illustrate the circuit board of a charging station comprising the conductive tracks in accordance with the invention.
Figure 7B:
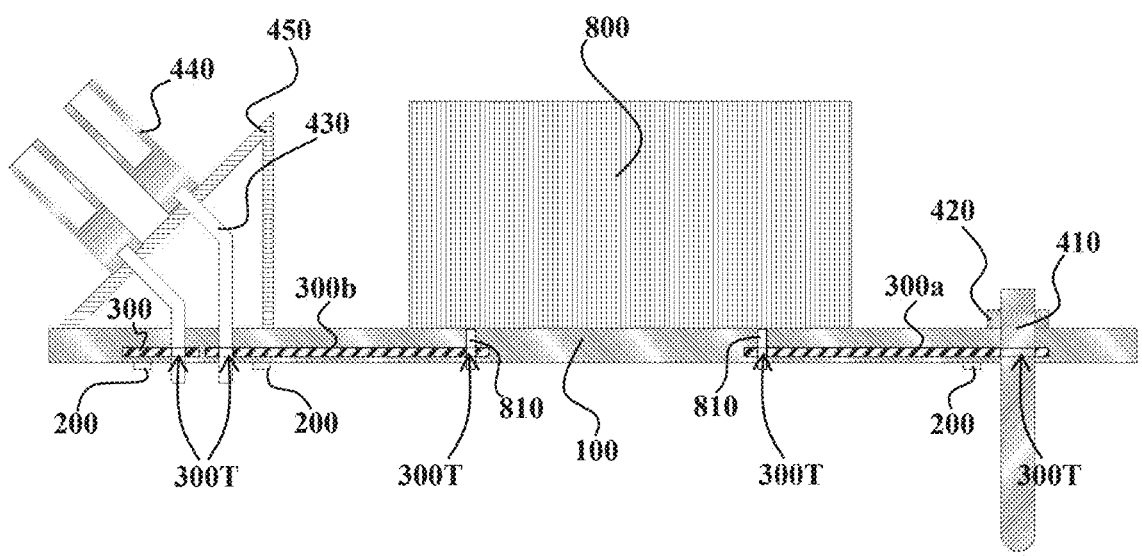

FIGS. 7a-7b illustrate the circuit board 100 of a charging station comprising the conductive tracks 300 in accordance with the invention. In this figure it is more clearly illustrated how FIG. 2a is connected with FIG. 2b, that is that the circuit board of FIG. 2a is the same circuit board of FIG. 2b. FIGS. 7a and 7b must also be read in view of FIGS. 5a and 5b, which illustrate the terminals 300T, 301T, 302T of the conductors 300. In these figures the earlier discussed further circuitry 800 is illustrated in a simplified way with one block. In practise this further circuitry 800 may be spread over the circuit board 100 and comprise many blocks or sub-blocks. This further circuitry may typically comprise components like relays, contactors, power supply and control electronics, for example.

Furthermore, only one electrical connector 410 is shown for the backside connections. In practise there are 3, 4 or 5, depending on the number of electrical phases that is fed to the charging station. These other electrical connectors 410 are not shown, because FIGS. 7a and 7b are cross-sectional views, and in practical embodiments these electrical connectors 410 are lined up in a direction orthogonal to the plane of the cross-section. On the socket side of the circuit board there are visible two type-2 socket connectors 440, but there are typically 7 of those in a type-2 socket, namely four power pins, 1 ground pin, and two signal pins.

FIG. 7a illustrates a cross-section of the circuit board 100 showing a conductive track 300G, which connects ground (PE) that is fed in from the backside of the circuit board 100 via the electrical connector 410. The electrical connect 410 extends through a terminal 300T of the conductive track 300G via the insert nut 420 as illustrated and makes electrical contact therewith. As there is no need to connect ground (PE) to anything in the further circuitry 800 it is simply routed to the other side towards the electrical connector 440. At this end the conductive track 300G is connected to said electrical connector 440 via a female pin 430 as earlier discussed. FIG. 7a further illustrates a support structure 450, which holds all the electrical connectors 440 and female pins 430 of a socket, for instance a type-2 socket.

FIG. 7b illustrates a cross-section of the circuit board 100 showing a conductive track, which is routed via the further circuitry 800. This may be typically the case where the conductive track serves to connect power pins on the backside with the socket on the frontside of the charging station. This implies that the conductive track has two parts, namely a first part 300a which runs from the electrical connector 410 to the further circuitry 800, and a second part 300b which runs from the further circuitry 800 to the female pin 430 and electrical connector 440 as illustrated. Similar to the terminals 300T on the ends where the pins are located, the terminals 300T of the conductive tracks 300a, 300b at opposite ends are connected to the further circuitry 800 via vias 810 as illustrated. This is standard technology.

Generally, the terms used in this description and claims are interpreted according to their ordinary meaning the technical field, unless explicitly defined otherwise. Notwithstanding, the terms "comprises" and "comprising" and variations thereof mean that the specified features, steps or integers are included. These terms are not interpreted to exclude the presence of other features, steps or integers. Furthermore, the indefinite article "a" or "an" is interpreted openly as introducing at least one instance of an entity, unless explicitly stated otherwise. An entity introduced by an indefinite article is not excluded from being interpreted as a plurality of the entity.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the embodiments described above, many equivalent modifications and variations will be apparent to those skilled in the art when given this disclosure. Accordingly, the embodiments of the invention set forth above are considered to be illustrative and not limiting. Various changes to the described embodiments may be made without departing from the scope of the invention.

The invention claimed is:

1. A circuit board for an electric vehicle charging station, comprising:
    circuitry for enabling the electric vehicle charging station to charge an electric
    vehicle, wherein the circuitry comprises at least one of a relay, a contactor, a power supply, and/or control electronics;
    a conductive track having a terminal for transferring electrical power between the
    conductive track and the exterior of the charging station, wherein current flows through the conductive track between a first position and a second position; and
    a temperature sensor configured to measure a temperature of the conductive track between the first position and the second position;
    wherein the temperature sensor and the conductive track are separated by at least one insulation layer so that the temperature of the conductive track is measurable by the temperature sensor through the at least one insulation layer.

2. The circuit board according to claim 1, wherein each of the at least one insulation layer is a layer of the circuit board.

3. The circuit board according to claim 2, wherein two insulation layers are contiguous.

4. The circuit board according to claim 1, wherein the at least one insulation layer is made of glass fibre.

5. The circuit board according to claim 1, wherein the terminal is connectable to an electrical connector for transferring electrical power from the conductive track to an electric vehicle.

6. The circuit board according to claim 1, wherein the terminal is connectable to an electrical connector for transferring electrical power from the exterior of the charging station to the conductive track.

7. The circuit board according to claim 1, wherein the temperature sensor is a thermistor.

8. The circuit board according to claim 1, wherein the temperature sensor and the conductive track are separated by a set of three insulation layers, the set having a thickness of from 200 to 300 μm.

9. The circuit board according to claim 1, wherein the temperature sensor is positioned over the conductive track between the first position and the second position thereof.

10. An electric vehicle charging station comprising a circuit board, wherein the circuit board comprises:
    circuitry for enabling the electric vehicle charging station to charge an electric
    vehicle, the circuitry comprising at least one of a relay, a contactor, a power supply, and/or control electronics;
    a conductive track having a terminal for transferring electrical power between the
    conductive track and the exterior of the charging station, wherein current flows through the conductive track between a first position and a second position; and
    a temperature sensor configured to measure a temperature of the conductive track between the first position and the second position;
    wherein the temperature sensor and the conductive track are separated by at least one insulation layer so that the temperature of the conductive track is measurable by the temperature sensor through the at least one insulation layer.

11. The electric vehicle charging station according to claim 10, comprising an electrical connector for transferring electrical power between the circuit board and the exterior of the charging station, the electrical connector being connectable to the terminal of the conductive track.

12. The electric vehicle charging station according to claim 11, wherein every electrical connector for transferring electrical power between the circuit board and the exterior of the charging station is connectable to a terminal for transferring electrical power between the conductive track and the exterior of the charging station.

13. The electric vehicle charging station according to claim 10, wherein the temperature sensor is positioned over the conductive track between the first position and the second position thereof.

14. A method of controlling the transference of electrical power between a conductive track of a circuit board and the exterior of an electric vehicle charging station, wherein the circuit board comprises:
    circuitry for enabling the electric vehicle charging station to charge an electric
    vehicle, the circuitry comprising at least one of a relay, a contactor, a power supply, and/or control electronics;
    a conductive track having a terminal for transferring electrical power between the
    conductive track and the exterior of the charging station, wherein current flows through the conductive track between a first position and a second position; and a temperature sensor configured to measure a temperature of the conductive track between the first position and the second position;

wherein the temperature sensor and the conductive track are separated by at least one insulation layer so that the temperature of the conductive track is measurable by the temperature sensor through the at least one insulation layer;

the method further comprising the steps of:

reading a first measurement from the temperature sensor;

waiting a pre-configured amount of time;

reading a second measurement from the temperature sensor;

calculating the temperature variation between the second and the first measurements; and if the temperature variation is greater than a pre-defined maximum temperature increase, breaking the transference of electrical power between the conductive track and the exterior of the charging station.

15. The method according to claim 14, comprising the step of, if the temperature variation is not greater than the pre-configured maximum temperature increase, enable, if not already enabled, the transference of electrical power between the conductive track and the exterior of the charging station.

16. The method according to claim 14, wherein the pre-configured amount of time is five seconds and the pre-configured maximum temperature increase is ten degrees Celsius.

17. The method according to claim 14, wherein the temperature sensor of the circuit board is positioned over the conductive track between the first position and the second position thereof.

* * * * *